United States Patent
Zhang

(10) Patent No.: US 9,653,484 B2
(45) Date of Patent: May 16, 2017

(54) ARRAY SUBSTRATE AND MANUFACTURING METHOD THEREOF, DISPLAY DEVICE, THIN-FILM TRANSISTOR (TFT) AND MANUFACTURING METHOD THEREOF

(71) Applicants: BOE Technology Group Co., Ltd., Beijing (CN); BEIJING BOE OPTOELECTRONICS TECHNOLOGY CO., LTD., Beijing (CN)

(72) Inventor: Jiaxiang Zhang, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/420,217

(22) PCT Filed: Jul. 17, 2014

(86) PCT No.: PCT/CN2014/082426
§ 371 (c)(1),
(2) Date: Feb. 6, 2015

(87) PCT Pub. No.: WO2015/106552
PCT Pub. Date: Jul. 23, 2015

(65) Prior Publication Data
US 2016/0027807 A1    Jan. 28, 2016

(30) Foreign Application Priority Data
Jan. 16, 2014   (CN) .......................... 2014 1 0021348

(51) Int. Cl.
*H01L 29/49*   (2006.01)
*H01L 27/12*   (2006.01)
(Continued)

(52) U.S. Cl.
CPC ........ *H01L 27/1222* (2013.01); *H01L 27/124* (2013.01); *H01L 27/127* (2013.01); *H01L 29/41733* (2013.01); *H01L 29/7869* (2013.01)

(58) Field of Classification Search
CPC .......................... H01L 27/1222; H01L 27/124
See application file for complete search history.

(56) References Cited

U.S. PATENT DOCUMENTS

2007/0268438 A1* 11/2007 Nakamura ........ G02F 1/136227
                                                         349/138
2011/0128459 A1*  6/2011 Chu .................... H01L 27/1255
                                                         349/38
2014/0008645 A1   1/2014 Yu

FOREIGN PATENT DOCUMENTS

CN   101078843 A   11/2007
CN   101174651 A    5/2008
(Continued)

OTHER PUBLICATIONS

Nov. 2, 2015—(CN)—First Office Action Appn 201410021348.9 with English Tran.
(Continued)

*Primary Examiner* — Michael Shingleton
(74) *Attorney, Agent, or Firm* — Banner & Witcoff, Ltd.

(57) ABSTRACT

An array substrate and a manufacturing method thereof, a display device, a thin-film transistor (TFT) and a manufacturing method thereof. The array substrate comprises a base substrate and a pixel electrode and a TFT formed on the base substrate. The TFT includes an active layer and a source/drain pattern. The source/drain pattern is connected with the active layer. The pixel electrode is connected with the active layer. The array substrate can improve the aperture ratio of pixels and the chargeability of the TFT.

16 Claims, 4 Drawing Sheets

(51) Int. Cl.
*H01L 29/417* (2006.01)
*H01L 29/786* (2006.01)

(56) References Cited

FOREIGN PATENT DOCUMENTS

| | | |
|---|---|---|
| CN | 101750825 A | 6/2010 |
| CN | 103094354 A | 5/2013 |
| CN | 103489921 A | 1/2014 |
| CN | 103762218 A | 4/2014 |
| JP | 2006286718 A | 10/2006 |

OTHER PUBLICATIONS

Mar. 23, 2016—(CN)—Second Office Action Application 201410021348.9 with English Tran.
Nov. 28, 2016—(CN) Fourth Office Action Appn 201410021348.9 with English Tran.
Aug. 26, 2016—(CN)—Third Office Action Appn 201410021348.9 with English Tran.

* cited by examiner

… (1)

ARRAY SUBSTRATE AND MANUFACTURING METHOD THEREOF, DISPLAY DEVICE, THIN-FILM TRANSISTOR (TFT) AND MANUFACTURING METHOD THEREOF

The application is a U.S. National Phase Entry of International Application No. PCT/CN2014/082426 filed on Jul. 17, 2014, designating the United States of America and claiming priority to Chinese Patent Application No. 201410021348.9 filed on Jan. 16, 2014. The present application claims priority to and the benefit of the above-identified applications and the above-identified applications are incorporated by reference herein in their entirety.

TECHNICAL FIELD

At least one embodiment of the present invention relates to an array substrate and a manufacturing method thereof, a display device, a thin-film transistor (TFT) and a manufacturing method thereof.

BACKGROUND

Thin-film transistor liquid crystal displays (TFT-LCDs) become mainstream products in liquid crystal displays (LCDs).

An array substrate is an important component of a TFT-LCD. The array substrate may comprise: a base substrate, gate lines and data lines formed on the base substrate, and pixel units defined by the gate lines and the data lines. A pixel unit includes a TFT and a pixel electrode. The TFT includes a gate electrode, an active layer, a source electrode and a drain electrode. The pixel electrode is electrically connected with the drain electrode.

Currently, a channel of the TFT generally adopts U-shaped design, L-shaped design or line design. FIG. 1 is a schematic structural view of a source/drain metal layer of an array substrate. As illustrated in FIG. 1, the source/drain metal layer includes a data line 211, a source electrode 212 and a drain electrode 213. In this example, the data line 211, the source electrode 212 and the drain electrode 213 are arranged on the same layer. The data line 211 and the source electrode 212 are integrally formed; the drain electrode 213 is connected with a pixel electrode (not shown in the figure); and the source electrode 212 and the drain electrode 213 are separately arranged.

SUMMARY

At least one embodiment of the present invention provides an array substrate and a manufacturing method thereof, a display device, a thin film transistor (TFT) and a manufacturing method thereof, which are used for improving the aperture ratio of pixels and the chargeability of the TFT.

An embodiment of the present invention provides an array substrate, which comprises a base substrate and a pixel electrode and a thin film transistor (TFT) formed on the base substrate. The TFT includes an active layer and a source/drain pattern. The source/drain pattern is connected with the active layer. The pixel electrode is connected with the active layer.

An embodiment of the present invention provides a display device, which comprises: the array substrate.

An embodiment of the present invention provides a method for manufacturing an array substrate, which comprises the step of forming a TFT and a pixel electrode on a base substrate. The step of forming the TFT includes the step of forming an active layer and a source/drain pattern. The source/drain pattern is connected with the active layer. The pixel electrode is connected with the active layer.

An embodiment of the present invention provides a TFT, which comprises an active layer and a source/drain pattern connected with the active layer. The source/drain pattern is one of a source electrode and a drain electrode of the TFT.

An embodiment of the present invention provides a method for manufacturing a thin film transistor (TFT), which comprises: forming an active material layer and forming an active layer by patterning the active material layer; and forming a source/drain metal layer and forming a source/drain pattern by patterning the source/drain metal layer, so that the source/drain pattern is one of a source electrode and a drain electrode and is connected with the active layer.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Figure 1:
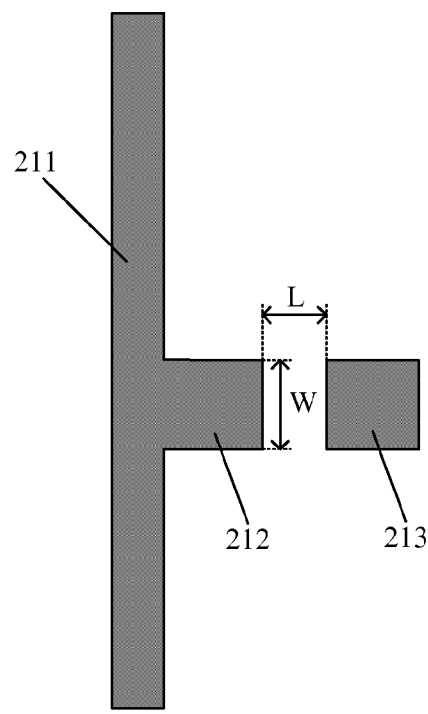
FIG. 1 is a schematic structural view of a source/drain metal layer of an array substrate.

In the array substrate as shown in FIG. 1, the width W of the channel of a TFT in a pixel unit is the width of the source electrode 212 or the drain electrode 213, and the length L of the channel of the TFT is the distance between the source electrode 212 and the drain electrode 213. The inventor of the present application found that: because the source electrode and the drain electrode in the structure are separately arranged, the area of the TFT is relatively large, and hence the aperture ratio of pixels can be reduced; moreover, as the source electrode and the drain electrode are separately arranged, the width/length ratio (W/L) of the channel of the TFT is relatively small, so that the charging current of the TFT is reduced, and hence the chargeability of the TFT can be reduced.

Figure 2:
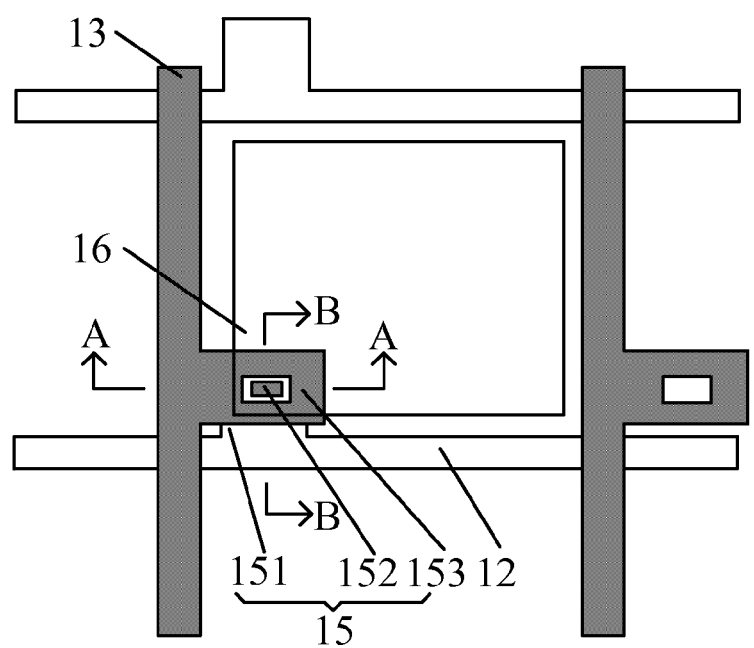
FIG. 2 is a schematic structural view of an array substrate provided by a first embodiment of the present invention.
Figure 3:
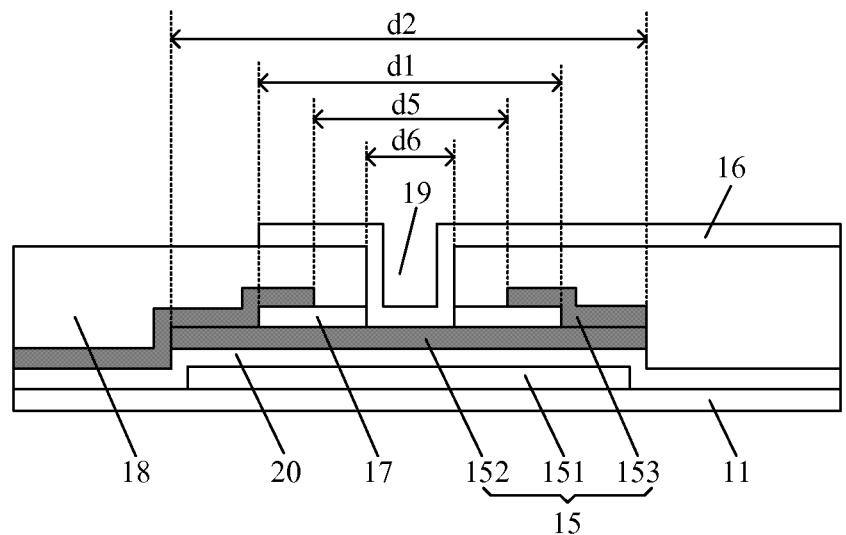
FIG. 3 is an A-A sectional view of FIG. 2.
Figure 4:
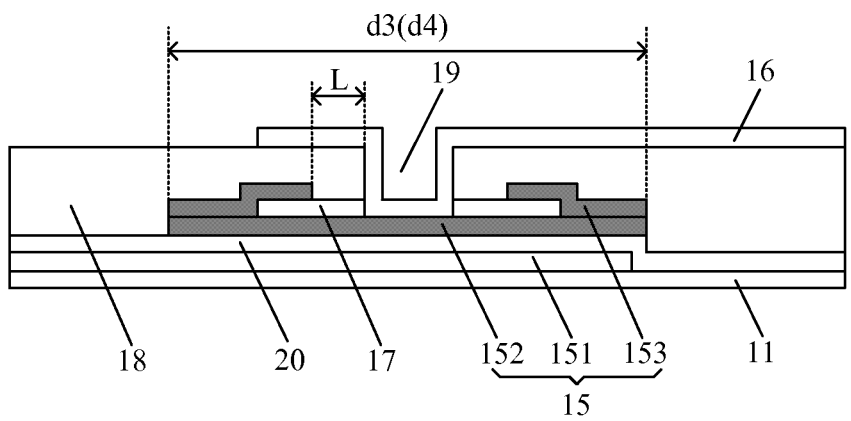
FIG. 4 is a B-B sectional view of FIG. 2.

FIG. 2 is a schematic structural view of an array substrate provided by the first embodiment of the present invention. FIG. 3 is an A-A sectional view of FIG. 2. FIG. 4 is a B-B sectional view of FIG. 2.

As illustrated in FIGS. 2 to 4, the array substrate comprises: a base substrate 11 and a line 12, a data line 13, a TFT 15 and a pixel electrode 16 formed on the base substrate 11. The TFT 15 includes a gate electrode 151, an active layer 152 and a source/drain pattern 153. The source/drain pattern 153 is connected with the active layer 152. The pixel electrode 16 is connected with the active layer 152. The gate line 12 and the data line 13 are intercrossed with each other to define pixel units. A pixel unit includes a TFT 15 acting as a switching element and a pixel electrode 16 used for display.

In the array substrate provided by the embodiment, the gate electrode 151 and the gate line 12 are connected with each other and integrally formed; the source/drain pattern 153 and the data line 13 are connected with each other and integrally formed; the gate electrode 151 and the gate line 12 are formed on the base substrate 11; the active layer 152 is formed on the gate electrode 151; and the source/drain pattern 153 is formed on the active layer 152. In one example, a gate insulating layer 20 is also formed on the gate electrode 151 and the gate line 12, and the active layer 152 is formed on the gate insulating layer 20 on the gate electrode 151.

Figure 5:
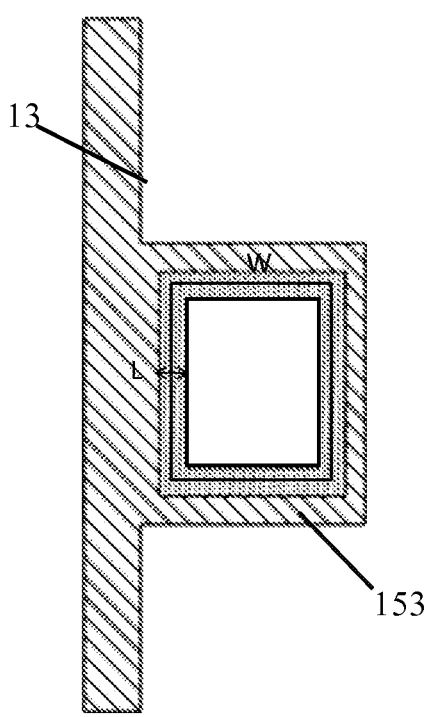
FIG. 5 is a schematic structural view of a source/drain pattern in FIG. 2.

In one example, the source/drain pattern 153 is one of the source electrode and the drain electrode of the TFT. FIG. 5 is a schematic structural view of the source/drain pattern. As illustrated in FIG. 5, in one example, the source/drain pattern 153 has an annular (ring) structure on the whole.

In one example, an etch stop layer 17 is formed on the active layer 152; the source/drain pattern 153 is formed on the etch stop layer 17; a protective layer 18 is formed on the source/drain pattern 153; a pixel electrode 16 is formed on the protective layer 18; a through hole 19 is formed in the etch stop layer 17 and the protective layer 18; the pixel electrode 16 is filled in the through hole 19 so as to be electrically connected with the active layer 152; and a portion of the pixel electrode 16 disposed in the through hole 19 is taken as the other of the source electrode and the drain electrode of the TFT. In one example, the through hole 19 and the source/drain pattern 153 may be concentrically arranged.

In one example, portion of the source/drain pattern 153 is disposed on the etch stop layer 17, and portion of the source/drain pattern 153 is disposed on the active layer 152 so as to be connected with the active layer 152. As illustrated in FIG. 3, in order to allow the source/drain pattern 153 to be connected with the active layer 152, the width d1 of the etch stop layer 17 is less than the first width d2 of the active layer 152. In one example, the width d1 of the etch stop layer 17 is less than the first width d2 of the active layer 152 by at least 1 micrometer, so that the contact area of the source/drain pattern 153 and the active layer 152 can be increased, and the source/drain pattern 153 and the active layer 152 can make good contact with each other (electrical contact).

In another embodiment, different from FIGS. 3 and 4, the TFT does not include the etch stop layer 17. That is to say, the source/drain pattern 153 is formed on the active layer 152; the protective layer 18 is formed to cover the source/drain pattern 153; the through hole 19 is formed in the protective layer 18 so as to expose the active layer 152; and the pixel electrode 16 makes contact with the active layer 152 via the through hole 19.

In the embodiment, the active layer 152 is an oxide semiconductor layer. For instance, the oxide semiconductor layer is made from indium gallium zinc oxide (IGZO). But the present invention is not limited thereto. The active layer may also be made of another appropriate semiconductor material. The pixel electrode 16 is made of a transparent conductive material. For instance, the transparent conductive material includes indium tin oxide (ITO), indium zinc oxide (IZO) or the like. For instance, the etch stop layer 17 is made of silicon oxide (SiO2). For instance, the protective layer 18 is made of an organic insulating material or an inorganic insulating material such as silicon nitride or silicon oxynitride.

As illustrated in FIG. 4, in order to allow the source/drain pattern 153 to make good contact with the active layer 152, the width d3 of the outer ring of the source/drain pattern 153 is greater than or equal to the second width d4 of the active layer 152. In the embodiment, for instance, the width d3 of the outer ring of the source/drain pattern 153 is equal to the second width d4 of the active layer 152.

As illustrated in FIG. 3, for instance, the width d5 of the inner ring of the source/drain pattern 153 is less than the width d1 of the etch stop layer 17, and hence the influence of an etching liquid, used in the process of forming the source/drain pattern 153, on the active layer 152 can be effectively avoided.

As illustrated in FIG. 3, the width d6 of the through hole 19 is less than the width d5 of the inner ring of the source/drain pattern 153, and hence the pixel electrode 16 in the through hole 19 is prevented from overlapping with the source/drain pattern 153 to communicate with it.

In the array substrate provided by the embodiment, when the gate line 12 provides a gate electrode signal to the gate electrode 151, the TFT 15 is switched on, and the source/drain pattern 153 is electrically communicated with the pixel electrode 16 through the active layer 152. At this point, the data signal provided by the data line 13 is outputted to the pixel electrode 16 through the source/drain pattern 153 and the active layer 152, and hence the pixel electrode 16 can be charged.

The charging current of the TFT 15 is $I_{on} = \mu_{eff}(\in_{ins}\in_0/t_{ins}))(W/L)(V_{gs}-V_{th})V_{ds}$, in which $\mu_{eff}$ refers to electron mobility; $\in_{ins}$ refers to relative dielectric constant; $\in_0$ refers to absolute dielectric constant; $t_{ins}$ refers to charging time; $V_{gs}$ refers to gate-source voltage; $V_{th}$ refers to threshold voltage; and $V_{ds}$ refers to drain-source voltage. For instance, as illustrated in FIG. 5, the width W refers to the circumference of the intermediate ring disposed at an intermediate position between the inner ring of the source/drain pattern 153 and the though hole 19. As illustrated in FIG. 4, the length L refers to the distance between the edge of the through hole 19 and the inner ring of the source/drain pattern 153. Because W refers to the circumference of the intermediate ring of the source/drain pattern 153, W is greatly increased. In the embodiment, L can be reduced by adjusting the size of the through hole 19. Thus, the width/length ratio W/L can be increased. As seen from the formula $I_{on}$ of the charging current, under the premise of ensuring unchanged $\mu_{eff}$, $\in_{ins}$, $\in_0$, $t_{ins}$, $V_{gs}$, $V_{th}$ and $V_{ds}$, in the embodiment, W is increased and L is decreased, so that the charging current $I_{on}$ of the TFT 15 is increased, and hence the chargeability of the TFT 15 can be improved.

In the array substrate provided by the embodiment, the TFT includes a gate electrode, an active layer and a source/ drain pattern. The source/drain pattern is connected with the active layer. The pixel electrode is connected with the active layer. In the embodiment, the source/drain pattern is provided so that the area of the TFT is reduced, and hence the aperture ratio of pixels can be improved. In the embodiment, the source/drain pattern is provided, so that the width/length ratio (W/L) of the channel of the TFT is increased, and hence the charging current of the TFT is increased, and consequently the chargeability of the TFT can be improved. In the embodiment, the length of the channel can be adjusted by adjusting the size of the through hole, and hence size of the channel can be flexibly set according to the production requirement.

The second embodiment of the present invention provides a display device, which may comprise an array substrate. For instance, the array substrate may adopt the array substrate provided by the first embodiment. No further description will be given here.

In the display device provided by the embodiment, the TFT includes a gate electrode, an active layer and a source/drain pattern. The source/drain pattern is connected with the active layer. The pixel electrode is connected with the active layer. In the embodiment, the source/drain pattern is provided, so that the area of the TFT is reduced, and hence the aperture ratio of pixels can be improved. In the embodiment, the source/drain pattern is provided, so that the width/length ratio W/L of a channel of the TFT is increased, and hence the charging current of the TFT is increased, and consequently the chargeability of the TFT can be improved. In the embodiment, the length of the channel can be adjusted by adjusting the size of the through hole, and hence the size of the channel can be flexibly set according to the production requirement.

The third embodiment of the present invention provides a method for manufacturing an array substrate, which comprises the step of: forming a gate line, a data line, a TFT and a pixel electrode on a base substrate. For instance, the step of forming the TFT includes the step of forming a gate electrode, an active layer and a source/drain pattern. The source/drain pattern is connected with the active layer. The pixel electrode is connected with the active layer.

Figure 6:
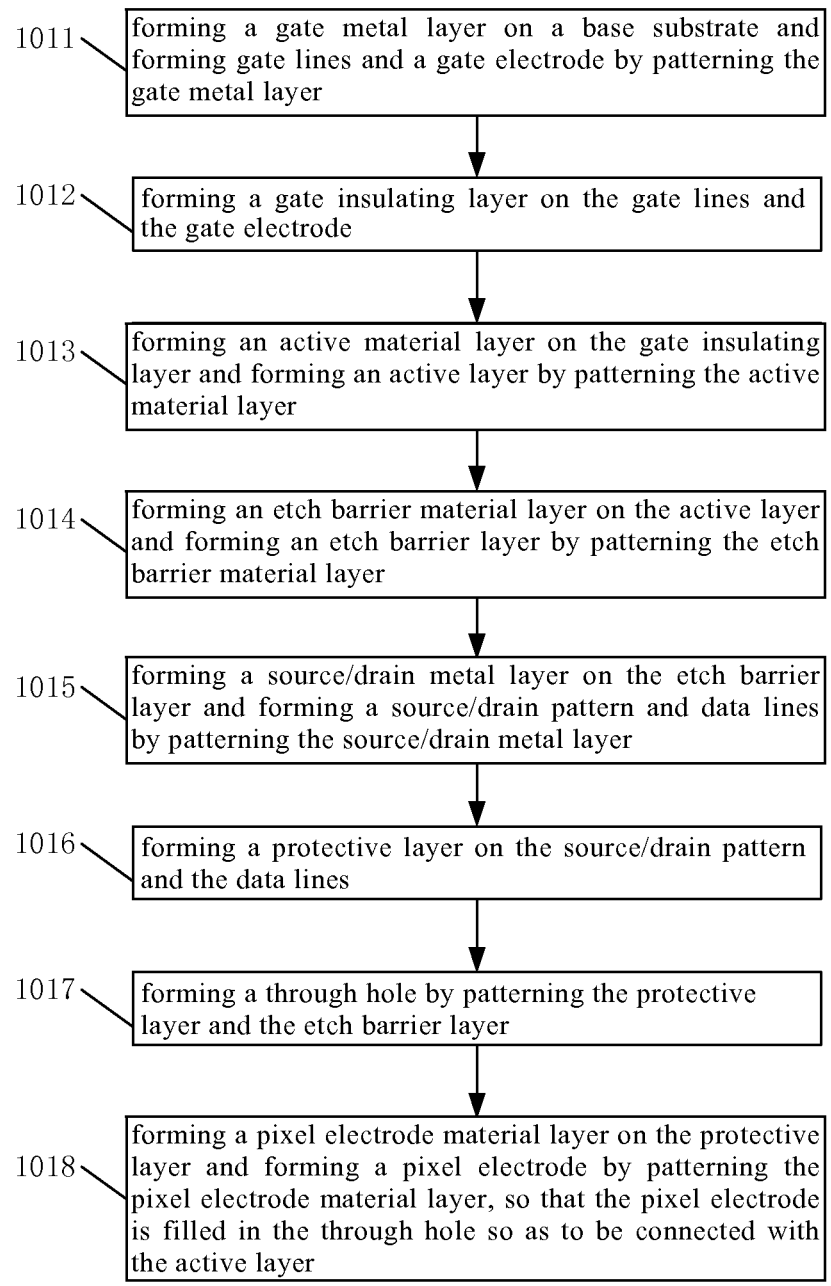
FIG. 6 is a flowchart of a method for manufacturing an array substrate, provided by a third embodiment of the present invention.

FIG. 6 is a flowchart of the method for manufacturing the array substrate, provided by the third embodiment. As illustrated in FIG. 6, the method comprises the following steps:

Step 1011: forming a gate metal layer on a base substrate and forming a gate line and a gate electrode by patterning the gate metal layer. In the embodiment, the patterning processes may include photoresist coating, exposure, development, etching, photoresist stripping and the like.

Step 1012: forming a gate insulating layer on the gate line and the gate electrode.

Step 1013: forming an active material layer on the gate insulating layer and forming an active layer by patterning the active material layer. In the step, etching in the patterning process include, for instance, wet etching.

Step 1014: forming an etch stop material layer on the active layer and forming an etch stop layer by patterning the etch stop material layer. In the step, etching in the patterning process is, for instance, dry etching.

Step 1015: forming a source/drain metal layer on the etch stop layer and forming a source/drain pattern and data lines by patterning the source/drain metal layer. In the step, the etching process in the patterning process includes wet etching. In one example, the source/drain pattern is one of the source electrode and the drain electrode of the TFT. In one example, the source/drain pattern has an annular (ring) structure.

Step 1016: forming a protective layer on the source/drain pattern and the data line.

Step 1017: forming a through hole by patterning the protective layer and the etch stop layer.

Step 1018: forming a pixel electrode material layer on the protective layer and forming a pixel electrode by patterning the pixel electrode material layer, so that the pixel electrode is filled in the through hole so as to be connected with the active layer.

The method for manufacturing the array substrate, provided by the embodiment, can be used for manufacturing the array substrate provided by the first embodiment. Detailed description of the array substrate may refer to the first embodiment.

In the array substrate manufactured by the method for manufacturing the array substrate, provided by the embodiment, the TFT includes a gate electrode, an active layer and a source/drain pattern. The source/drain pattern is connected with the active layer. The pixel electrode is connected with the active layer. In the embodiment, the source/drain pattern is provided, so that the area of the TFT is reduced, and hence the aperture ratio of pixels can be improved. In the embodiment, the source/drain pattern is provided, so that the width/length ratio (W/L) of the channel of the TFT is increased, and hence the charging current of the TFT is increased, and consequently the chargeability of the TFT can be improved. In the embodiment, the length of the channel can be adjusted by adjusting the size of the through hole, and hence size of the channel can be flexibly set according to the production requirement.

The fourth embodiment of the present invention provides a TFT. The TFT comprises a gate electrode, an active layer and a source/drain pattern connected with the active layer. In one example, the source/drain pattern is one of a source electrode and a drain electrode of the TFT. In one example, the source/drain pattern has an annular structure. The TFT provided by the embodiment can be applied to the array substrate provided by the first embodiment.

The fifth embodiment of the present invention provides a method for manufacturing a TFT. The method comprises: forming a gate electrode; forming a gate insulating layer; forming an active material layer and forming an active layer by patterning the active material layer; and forming a source/drain metal layer and forming a source/drain pattern by patterning the source/drain metal layer, so that the source/drain pattern is connected with the active layer. In one example, the source/drain pattern is one of a source electrode and a drain electrode. The method for manufacturing the TFT, provided by the embodiment, can be used for manufacturing the TFT provided by the embodiment 4.

It should be understood that: the foregoing embodiments are only preferred embodiments configured to illustrate the principles of the present invention, but the present invention is not limited thereto. Various modifications and improvements may be made by those skilled in the art without departing from the spirit and essence of the present invention. The modifications and improvements should also fall within the scope of protection of the present invention.

The application claims priority to the Chinese patent application No. 201410021348.9 submitted on Jan. 16, 2014. The disclosure of the Chinese patent application is entirely incorporated herein by reference as part of the application.

The invention claimed is:

1. An array substrate, comprising a base substrate and a pixel electrode and a thin-film transistor (TFT) formed on the base substrate,
   wherein the TFT includes an active layer and a source/drain pattern; the source/drain pattern is connected with the active layer; and the pixel electrode is connected with the active layer; and
   an etch stop layer is provided on the active layer; the source/drain pattern is provided on the etch stop layer; a protective layer is provided on the source/drain pattern; the pixel electrode is provided on the protective layer; a through hole is provided in the etch stop layer and the protective layer; and the pixel electrode is filled within the through hole so as to be connected with the active layer.

2. The array substrate according to claim 1, wherein the source/drain pattern is one of a source electrode and a drain electrode of the TFT.

3. The array substrate according to claim 1, wherein the source/drain pattern has an annular structure.

4. The array substrate according to claim 1, wherein a width of the etch stop layer is less than a first width of the active layer by at least 1 micrometer.

5. The array substrate according to claim 1, wherein a width of an outer ring of the source/drain pattern is greater than or equal to a second width of the active layer.

6. The array substrate according to claim 1, wherein a width of an inner ring of the source/drain pattern is less than a width of the etch stop layer.

7. The array substrate according to claim 1, wherein a width of the through hole is less than a width of an inner ring of the source/drain pattern.

8. The array substrate according to claim 1, wherein a charging current of the TFT is $I_{on}=\mu_{eff}(\in_{ins}\in_0/t_{ins})(W/L)(V_{gs}-V_{th})V_{ds}$, in which $\mu_{eff}$ refers to electron mobility; $\in_{ins}$ refers to relative dielectric constant; $\in_0$ refers to absolute dielectric constant; $t_{ins}$ refers to charging time; $V_{gs}$ refers to gate-source voltage; $V_{th}$ refers to threshold voltage; $V_{ds}$ refers to drain-source voltage; the width W refers to a circumference of an intermediate ring of the source/drain pattern; and the length L refers to a distance between an edge of the through hole and an inner ring of the source/drain pattern.

9. A display device, comprising the array substrate according to claim 1.

10. A method for manufacturing an array substrate, comprising forming a TFT and a pixel electrode on a base substrate, wherein forming the TFT includes forming an active layer and a source/drain pattern, in which the source/drain pattern is connected with the active layer and the pixel electrode is connected with the active layer; an etch stop layer is provided on the active layer; the source/drain pattern is provided on the etch stop layer; a protective layer is provided on the source/drain pattern; the pixel electrode is provided on the protective layer; a through hole is provided in the etch stop layer and the protective layer; and the pixel electrode is filled within the through hole so as to be connected with the active layer.

11. The method for manufacturing the array substrate according to claim 10, wherein forming the TFT and the pixel electrode includes:
   forming an active material layer and forming the active layer by patterning the active material layer;
   forming an etch stop material layer on the active layer and forming an etch stop layer by patterning the etch stop material layer;
   forming a source/drain metal layer on the etch stop layer and forming the source/drain pattern by patterning the source/drain metal layer;
   forming a protective layer on the source/drain pattern;
   forming a through hole by patterning the protective layer and the etch stop layer; and
   forming a pixel electrode material layer on the protective layer, forming the pixel electrode by patterning the pixel electrode material layer, and filling the pixel electrode into the through hole.

12. The method for manufacturing the array substrate according to claim 10, wherein forming the source/drain pattern includes: forming a source/drain metal layer and forming the source/drain pattern by patterning the source/drain metal layer, so that the source/drain pattern is one of a source electrode and a drain electrode.

13. A thin film transistor (TFT), comprising an active layer and a source/drain pattern connected with the active layer,
   wherein the source/drain pattern is one of a source electrode and a drain electrode of the TFT.

14. The TFT according to claim 13, wherein the source/drain pattern has an annular structure.

15. The array substrate according to claim 2, wherein the source/drain pattern has an annular structure.

16. The array substrate according to claim 2, wherein a width of the etch stop layer is less than a first width of the active layer by at least 1 micrometer.

* * * * *